(12) United States Patent
Werfel et al.

(10) Patent No.: US 7,048,840 B1
(45) Date of Patent: May 23, 2006

(54) METHOD FOR METAL COATING THE SURFACE OF HIGH TEMPERATURE SUPERCONDUCTORS

(75) Inventors: Frank Werfel, Leipzig (DE); Uta Flögel-Delor, Losswig (DE); Rolf Rothfeld, Mockrehna (DE); Dieter Wippich, Beilrode (DE)

(73) Assignee: Adelwitz Technologiezentrum GmbH, Adelwitz (DE)

( * ) Notice: Subject to any disclaimer, the term of this patent is extended or adjusted under 35 U.S.C. 154(b) by 0 days.

(21) Appl. No.: 10/362,466

(22) PCT Filed: Aug. 29, 2000

(86) PCT No.: PCT/DE00/02966

§ 371 (c)(1),
(2), (4) Date: Feb. 19, 2003

(87) PCT Pub. No.: WO02/16674

PCT Pub. Date: Feb. 28, 2002

(30) Foreign Application Priority Data

Aug. 19, 2000 (DE) .............................. 100 40 935

(51) Int. Cl.
*B41M 5/20* (2006.01)
*C25D 5/00* (2006.01)
*B05D 5/12* (2006.01)
*H01L 39/24* (2006.01)

(52) U.S. Cl. .......................... 205/51; 205/89; 205/182; 205/239; 205/291; 29/599; 505/470; 505/472; 427/62

(58) Field of Classification Search .................. 427/62; 505/470, 472; 29/599; 205/51, 89, 182, 205/239, 240, 227, 291
See application file for complete search history.

(56) References Cited

U.S. PATENT DOCUMENTS

| 3,328,271 | A | * | 6/1967 | Kneip, Jr. et al. ............ 205/51 |
| 3,582,479 | A | * | 6/1971 | Urban et al. ................ 205/103 |
| 3,866,315 | A | * | 2/1975 | Ziemek ........................ 29/599 |
| 3,974,043 | A | * | 8/1976 | Sczepaniak et al. .......... 205/51 |
| 4,914,081 | A | * | 4/1990 | Miller et al. ................ 505/211 |
| 5,379,020 | A |   | 1/1995 | Meier et al. |

(Continued)

FOREIGN PATENT DOCUMENTS

CH 527 911 9/1972

(Continued)

OTHER PUBLICATIONS

Patent Abstracts of Japan—JP 05 106080-Aug. 20, 1993 Apr. 27, 1993.

(Continued)

*Primary Examiner*—Brian K. Talbot
(74) *Attorney, Agent, or Firm*—Horst M. Kasper (57) ABSTRACT

The invention relates to a method for metal coating the surface of high temperature superconductors with a copper-oxygen base structure. The aim of the invention is to achieve a method as above, which requires a low production complexity, serves for the production of contacts with a low electrical and/or thermal transfer resistance and which increases the stability of the metallization. Said aim is achieved whereby copper is applied to give low-ohmic contacts, and the linked achievement of a stable metallization between the HTS and the electrical and/or thermal coupling. Further advantageous effects are achieved with the method whereby the copper is applied in the form of copper alloys, in particular as copper-nickel or copper-zinc alloys. On applying the method it is furthermore of advantage for the creation of fine grained surface coatings to overlay the galvanic cell with a permanent and/or alternating magnetic field.

58 Claims, 2 Drawing Sheets

U.S. PATENT DOCUMENTS 6,120,669 A * 9/2000 Bradley .................. 205/114
6,194,093 B1 * 2/2001 O'Brien .................. 429/10

FOREIGN PATENT DOCUMENTS

| DE | 24 14 744 | 10/1975 |
| DE | 40 18 870 | 8/1991 |
| DE | 4018870 | 8/1991 |
| DE | 41 17 489 | 12/1992 |
| DE | 42 20 925 | 1/1994 |
| DE | 44 18 050 | 1/1995 |
| DE | 199 39 144 | 3/2001 |
| DE | 19939144 | 3/2001 |
| EP | 0 328 651 | 8/1989 |
| EP | 0328651 | 8/1989 |
| JP | 36540 | * 8/1972 |
| JP | 05106080 | 4/1993 |
| JP | 258623 | * 10/1993 |

OTHER PUBLICATIONS

Electrodeposition of Metals on Cuprate Superconductors from Organic Electrolytes.—Rosamilia J M et al—vol. 89/2 1989 XP00027706—Feb. 1989.

Database WPI, Section CH, Week 199649 XP002169983.

J.M. Rosamilia B. Miller Electrodeposition of Metals on Cuprate Superconductors from Organic Electrolytes Feb. 1989.

Database WPI XP002169983 Mar. 10, 1996.

* cited by examiner

METHOD FOR METAL COATING THE SURFACE OF HIGH TEMPERATURE SUPERCONDUCTORS

BACKGROUND

The invention relates to a method for the metallic coverage of surfaces of high temperature superconductors (HTS) based on a Copper-Oxygen structure. High temperature superconductors because of their superior technical properties are used as electrical devices in the energy technique. The superconductors are of the chemical compositions $Bi_2Sr_2CaCu_2O_{8-x}$ (Bi 2212) or $Bi_2Sr_2Ca_2Cu_3O_{10+y}$ (Bi2223) and the 123 family $Y_1Ba_2Cu_3O_{7-\delta}$ (Y123). The compounds for the technical application need electrical or thermal contacts, electrical or thermal shunts or surface layers for passivation and stabilization purpose. Although the Y123 superconductor exhibit excellent physical properties, the fabrication of large conductor length is to date unsucceeded and still a challenge. In contrast, Bi superconductors are produced in km length units. The Ag matrix is a prerequisite of the Bi wires, however this prevents some applications, e.g. the direct use for current leads and fault current limiters (FCL). The high electrical and thermal conductivity of Ag increases the desired low heat conductivity (current lead). The fast resistivity increase is necessary for the effective limiting behavior in case of an electrical fault. Again, the Ag matrix prevents the fast limiting behavior. A possible alternation are alloys of the type AgAu/Ag and Ag/AgMg which show in combination with the Bi HTS a lower electrical resistivity and a smaller coefficient of thermal conductivity compared to metalic silver. A disadvantage of this conductor type are the higher costs for the silver matrix.

German Patent DE 42 20 925 C2 discloses a powder metallic method for the fabrication of electrical contacts on HTS material whereby the contact are cold uniaxially pressed followed by a sinter procedure. The pressed powder consists either of HTS material or non-superconducting precursor are used. Furthermore, DE 44 18 050 A1 discloses a method for the inductive limiting of electrical faults using a superconducting hollow cylinder. Local overheating areas so called "hot spots" are prevented by metallic layers with a high specific resistivity $>\mu\Omega cm^2$ at 77 K, especially by metallic conductors of lead, antimony, indium, bismuth, steel, tin or zinc including their alloys. The above patent application describes an HTS tube encircled with an arming metal shunt for the current limiting in the corresponding devices. The physical key of the shunt is the quality of the electrical contact between the metallic layer and the ceramic superconductor. Because most of the metals and alloys are not composition elements of the new superconductors (except bismuth) a strong bonding can hardly be generated. The metals tend to oxidize and the stability of the metal-HTS compound is influenced negatively. Long-time degradation will appear. The combination of bulk Bi2212 HTS with metallic conductors, preferred noble metals silver, gold, ruthenium, osmium rhodium, iridium, palladium or platinum is disclosed in DE 41 24 980 A1. In the s called melt cast process after DE 38 30 092 OS tubes f Bi2212 are fabricated. During the fabrication melting process metallic wires e.g. silver wires are included along the total tube length or a both ends. This wire stabilizes the superconductor and allows simultaneously a current lead function from the endgaps. This in-situ method is expensive and can destroy the homogeneous structure of the superconductor. Furthermore, at a temperature of 870° C. the process can produce different non-superconducting phases.

Accordingly, the key issue of the present invention relates to a method of metallic deposition on the surface of high temperature superconductors with a copper oxygen basic structure. A major advantage of the invention is the less expensive procedure by fabricating electrical contacts with a low electrical and thermal transfer resistance and with a high stability of the metallic layer. A principal solution is given in claim 1. Preferred embodiments of the invention are specified in the claims 2 to 10. In the further description the invention is explained by an example.

DECRIPTION

Referring to the figures in the following the invention of a method for the deposition of metallic layers of copper or copper alloys on the surface of high temperature superconductors is explained. The major advantage of this type of deposition disclosed in claim one is the peculiarity and the unique position of the element copper as the chemical and structural carrier of all new HTS materials. Because of the physical and chemical affinity of copper alloyed copper alloyed layers and structures between surfaces and interfaces and the HTS the method show strong bonding metal-HTS compounds, especially in the long time behavior. The deposition method of metallic copper on HTS is utilized for the fabrication of electrical, thermal or optical contacts. The primary disadvantage of all the other layer and coating techniques, e.g. vacuum techniques, is their expensive and time-consuming process. The here disclosed deposition technology is an easy to perform, fast and economical procedure.

Surprisingly, the galvanic and electrochemical plating method can be performed on ceramic superconductors. The plating method requires a non-vanishing electrical conductivity of the material at room temperature. For practical application of the new superconductors the metallic deposition gives an improvement of material properties and application parameters. The plating process of bulk HTS, thin and thick films, wires and tapes with copper and copper alloys has the a number of principal advantages:

(1) The HTS surfaces are passivated against chemical and mechanical aggressive environments.
(2) Improvement of current and voltage stability of a superconductor under high electrical loads.
(3) Enhancement of the mechanical properties (tensile strength, hardness) due to a filling effect of microcrackes and pores from the surface.
(4) The layer is useful as an interface for better sticking and contact properties in the deposition procedure of further layers, especially of noble metals like silver, gold, platinum, iridium, rhodium, ruthenium, osmium, palladium tungsten, further nickel, chromium, rhenium and their alloys.
(5) The copper metallic layer improves the thermal dynamical coupling of superconductors at cryogenic sources (6) The copper layer reduces the roughness of HTS surfaces and gives a higher flatness with the possibility of polishing optical surfaces
(7) The layer has the advantage of simple soldering the HTS to fabricate connectors and allow simple joining of HTS components (solderability)
(8) A preferred embodiment of the layers includes the easy fabrication of pressed and clamped contacts on HTS
(9) The plated layers on polycrystalline HTS has a bypass character with the effect, that transport currents can bypass grain boundary barriers and other electrical barriers in the HTS conductor to improve the electrical stability.

With the here disclose invention it is shown that the layer deposition with copper or copper alloys on high temperature superconductors the stability of the superconducting components and devices under high electrical loads especially alternating loads like electrical faults, over-voltage effects, mechanical loads, chemical attacks or the stability under cryogenic fault is substantially improved.

Figure 1:
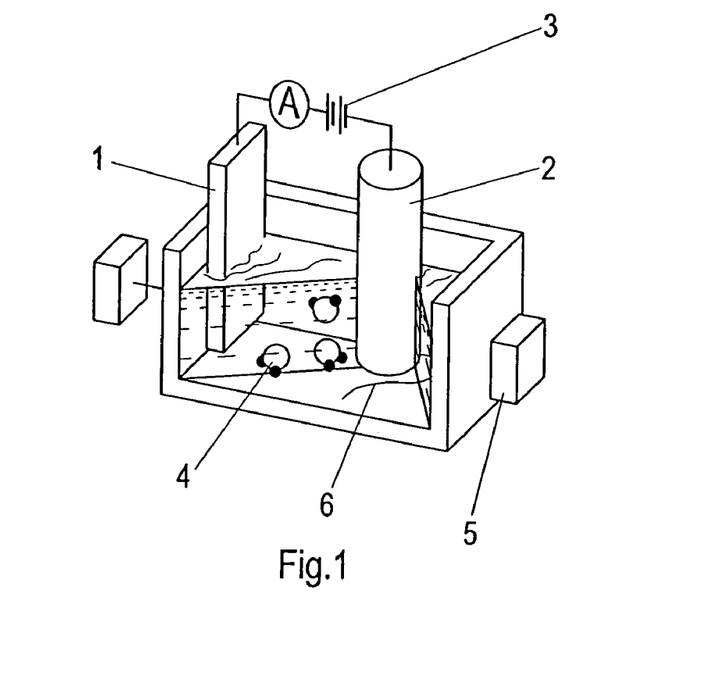
FIG. 1 is a schematic view of the Cu plating system for HTS

Referring to the FIG. 1 a preferred electrolytic cell with the anode 1 and the cathode 2 is operated by a DC source 3 to drive the electrolytic process. The electrolytic deposition of copper on high temperature superconductors is most effective in a copper sulfur acid solution 4 by applying high current density. Furthermore it is another object of the invention to use an electrolytic bath of alkaline copper cyanide.

Plating of copper alloys on HTS is still a further object of the invention and utilizes an electrolytic mechanism wherein due to the choice of the electrolytic ion concentration in the solvent the individual current potential curves are shifted so to obtain a common deposition potential. It is yet another object of the invention that the plating process is combined with interfering parallel processes in order to homogenize the layers and to provide grain refinement of the metallic layers. These techniques are:
(a) Ultrasonic treatment and excitation of the electrolytic solution
(b) Application of magnetic fields during the plating
(c) Pulse current plating (forward/reverse)

These additional treatment steps can be applied in a single process or in combination.

According to the invention the following copper alloys are performed in electrodeposition:
Copper zinc alloys (brass); as stoichiometric ratio of Cu:Zn=1:1 in the plating process results in a layer composition Cu—Zn of 70:30.
Copper—Tin (tin bronze)
Copper—Alumina (alumina bronze)
Copper—Nickel (monel)
Copper—Beryllia (beryllia bronze—high strength)

The plating of alloys requires to take the chemical polarization into account which the multi-component electrodeposition may accelerate or in a worst case prevent any deposition.

DETAILED DESCRIPTION OF THE PREFERRED PROCESSES

For an effective plating process the electrolytic solution is moved in a circular process in permanence or periodically to remove impurities and to prevent sticking of reaction products on the HTS surface under high chemical current densities.

The current source as further object of invention is assembled for low HTS cathode conductivity and allows the current flow constant, reverse or in a wide ratio of pulse plating. The period and time ratio between positive current, zero and negative current is variable in a range from 0.001 Hz (1000 s) to 1 kHz (1 ms). Due to pulse plating the applied chemical current density enables substantially higher values equivalent faster deposition. The layers become fine grained and are mechanically stable.

It is another object of the invention using a magnetic assembly 5 to apply a magnetic field 6 close to anode or close to cathode. The resulting Lorentz force is $$F=Cu^{2+}/(Me^{2+}(v \times B)),$$

with v=velocity of the charged ions, B=magnetic flux density. The force component provides together with the flowing catalytic better conditions for a homogeneous and fine-grained layer structure.

The electrical properties of copper alloys and high temperature superconductors are summarized in Table 1.

TABLE I

Comparison of the specific electrical resistance of Cu alloys and Bi and Y123 HTS. at different temperatures

|  | $\rho(77K)$ [$\mu\Omega cm$] | $\rho(100K)$ [$\mu\Omega cm$] | $\rho(293K)$ [$\mu\Omega cm$] |
| --- | --- | --- | --- |
| $Bi_2Sr_2CaCu_2O_{8+y}$ |  | 800 | 1200 |
| $Y_1Ba_2Cu_3O_{7-\delta}$ |  | 1000 | 1500 |
| Copper, metallic | 0.2 | 0.4 | 1.6 |
| Brass 80/20 | 3.8 | 4.3 | 6.8 |
| Brass 70/30 | 4.6 | 4.9 | 6.8 |
| CuNi 70/30 | 36.5 | 37 | 38 |
| CuNiMn 54/45/1 | 32 | 33 | 35 |
| CuAl |  |  | 11,4 |
| CuSn 3 | 9.6 | 9.7 | 10.1 |

It is still a further object of the invention in fault current limiter (FCL) to provide an electrical shunt comprising a copper nickel alloy with the advantage of homogenizing and stabilizing the HTS conductor in case of high current fault. The CuNi layer provides a nearly temperature independent specific electric resistance which in case of superconductive state carries almost no current whereas in case of switching the superconductor in the resistive state (driven by a fault current) the transient high current will flow through the adjacent metallic layer bypassing hot spots or weak HTS conductor parts.

Figure 2:
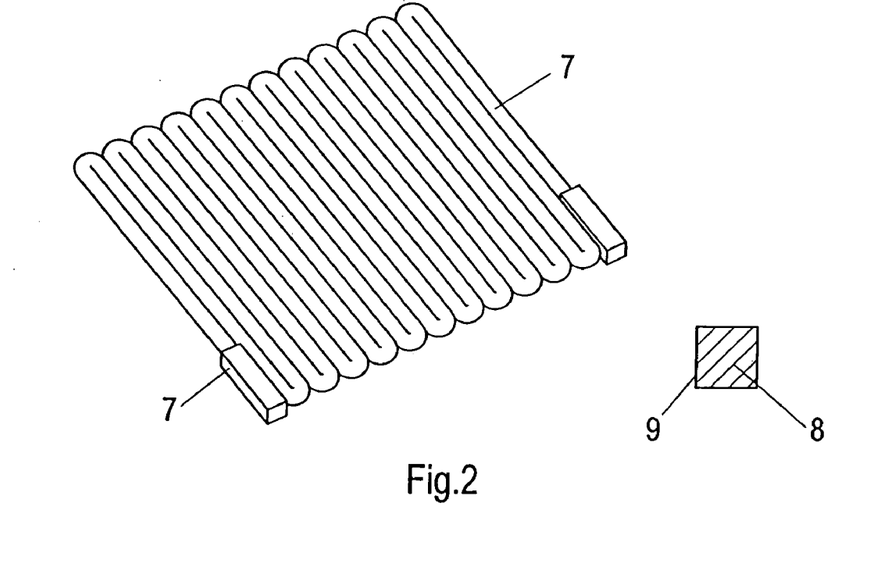
FIG. 2 is a schematic of a meander-like coated superconductor for fault current limiting purpose

The CuNi deposition on HTS surfaces is performed using copper phosphor acid or alkaline copper cyanide solutions. A bath of a copper nickel plating process for the deposition with up to 50% Ni on HTS surfaces has the catalytic composition
Copper Pyrophosphate $Cu_2P_2O_7$ 5–10 g/l
Nickel Chloride $NiCl_2 \times 6H_2O$ 40–90 g/l
Pothassium Pyrophosphate oder Sodium-Pyrophosphate $(K/Na)_4P_2O_7 \times 10H_2O$ 300–400 g/l FIG. 2 illustrates a possible shape of a YBCO HTS meander module 7 with a copper nickel surface deposition for a fast resistive fault current limitation in a net of electric power supply. An important feature for the effective fault current limitation is long length superconductor with a cross section 8 which can carry the normal current without larger losses. In case of an electrical fault accompanied by a very fast increase of the current substantially higher than the critical current density the superconductor switches in a very short time of typical less than 1 ms into the resistive state and limits the current. As an advantage the limitation process has requires no trigger signal (as in electronic devices). The switching into the resistive state is caused by the fault current itself. Because of this properties FCL devices are favorite application of the new superconductors.

In the transient state of this resistive FCL type the limitation process causes in a very short time Joule heat in the superconductor. Therefore, design and assembling of an FCL is calculated according to electrical parameters current and voltage. Both parameters determine the necessary limiting resistance without ($R_1$) and with metallic shunt ($R_1^B$) give by the length 1 of the superconductor:

$R_1 = \rho 1/A$ without metallic shunt $R_1^B = (\rho_{sc} + \rho_m) 1/(A_{sc} + A_m)$ with metallic shunt $\rho_{sc}$, and $\rho_m$ are the specific electric resistance values and $A_{sc}$, $A_m$ are the cross section parameter for the superconductor and the metallic shunt, respectively.

The above described operation is typical for all types of resistive superconducting limiters A key feature of the technical device design and operation is the exclusion of so called hot spots. The combination of the superconductor with a high resistive metallic copper alloy layer 9, preferred CuNi, improves the homogeneity and stability of the superconducting material in the fault current limitation function. According to Table 1 in case of a fault immediately followed by the quench is the specific resistance of the HTS substantially higher than that of the metallic layer and the current will flow through the metal and protect the superconductor. The FCL device design is made so to carry a normal current of say, 2000 A. In case of a fault the current grows fast to multiple of the normal value. At the same time the superconductor with a critical transport current density of 10 kA/cm$^2$ and a cross section of 6×8 mm$^2$=0.48 mm$^2$ limits the current of the fault to about 5 kA.

A 10 kV power supply needs about sixteen limiting YBCO modules of 4.8 m length which gives a conductor length of about 77 m.

Figure 3:
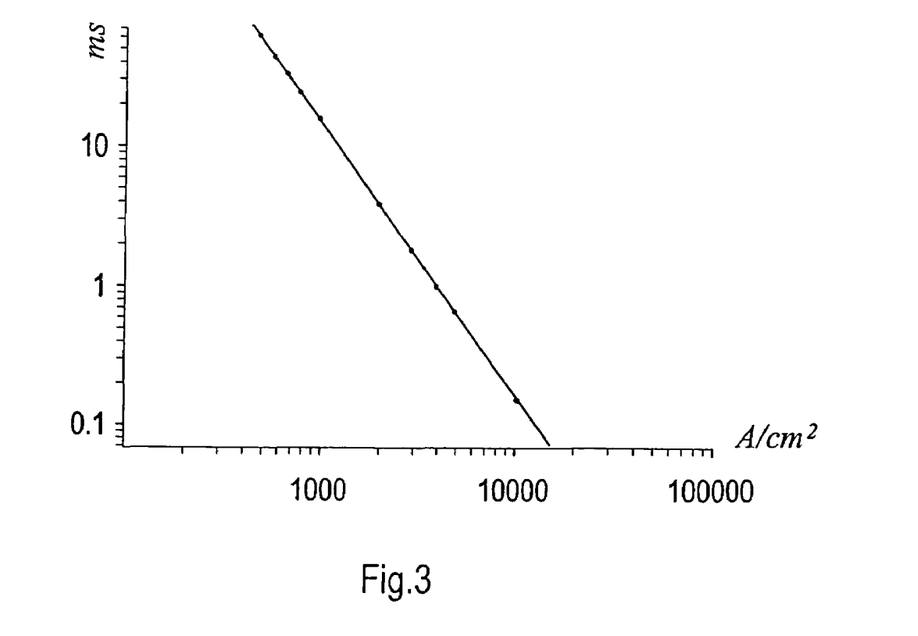
FIG. 3 shows the calculated critical quench time of superconducting FCL as a function of the critical current density Jc

The limiting behavior of an FCL device depends according to FIG. 3 on the critical current density of the superconductor Jc, the design of the superconductor-metal combination (ratio of the cross sections) and it depends on the total conductor length. In order to obtain an efficiency limitation a switch time constant of 1 ms is required. According to the calculation in FIG. 3 and including the material parameters of melt text YBCO (electrical and thermal coefficients) a critical current density of about 4 kA/cm$^2$ is necessary to obtain a switching time of about 1 ms. If this time constant is longer, e.g. 5 ms, the HTS resistivity is developed more slowly and limitation is set in later in the transient process equivalent to a higher current.

Basically, a very long conductor has a current limiting effect in case of a fault due to the so called "flux flow" resistivity. This limitation effect is based on electrical fields between 1–10 V/m in contrast to fields of about 100 V/m in the "ohmic" resistivity limitation of the fault current. Because of the low electric field in the flux flow case for a 10 kV power net the conductor length has to >1000 m. Although the dissipation E×J is low, due to the long conductor length the device expenses are increased. Economically more attractive is therefore a resistive fault current limiter with shorter conductor length, whereas the electric field at the conductor in case of limitation is between 100–300 V/m. The limiting resistivity is determined by superconducting material above the critical temperature (see Table 1). It should be noted that in case of the limitation holding for longer times up to several hundred milliseconds the conductor temperature can grow very fast to a few hundred Celsius. So, at least after 300–400 ms a conventional power switch has to disconnect the FCL device from the power line. An important feature of the FCL function is the homogeneity of the conductor in order to distribute the electric load over the total conductor length symmetrical. In addition, the maximum temperature of the conductor after the quench gives the lower limit for total superconducting volume.

It is an important object of the invention to improve the conductor homogeneity by the electrodeposition of CuNi on the HTS. This method reduces the hot spot probability at the conductor, allows a higher current load of the FCL device and gives a better ratio between limited fault cent, virtual fault current and normal current.

It is still a further object of the invention to deposit CuNi layer on HTS; to provide a better stability of HTS current leads. Superconducting current leads are used to transport high level DC of AC currents from room temperature to a lower temperature level without the transfer of heat into the cold box. Hereby is utilized an effect that the superconductor does not follow the Wiedemann-Franz law valid for metals, after which the electrical conductivity (of a metal) is always coupled with the thermal conductivity. Hence the superconductor transport the (high) current but a minimal heat only.

The function of electrical shunt design can be found in a number of patent applications and publications (DE 44 30 408 A1, DE 197 29937 C1, U.S. Pat. No. 5,432,297). However, the shunt technique and design is described less exact. Quality and function of the metallic shunt depend substantially on thermal coefficient of heat transfer to restrict the unwanted heat transportation into the lower temperature reservoir. In case of silver material as shunt (with a high thermal coefficient) it is optimal to use AgAu/Ag alloys. The disadvantage is the high price of noble metals.

Again, it is another object of the invention to provide a galvanic metallic deposition of CuNi alloy with a low thermal heat transfer by the disclose method on the HTS current lead to improve the stability. Practically, a CuNi 80/20 alloy with a coefficient of thermal heat transfer of 0.1 W/cm K at 77 K is deposited by the electrochemical process. The contacting areas for soldering the copper wires are preferably fabricated by metallic copper deposition. Thereby, the metallic copper layer on HTS shows a high strength due to the fact that the surface Cu atoms have an interbonding to the bulk Cu in the HTS and, in addition, the Cu penetrates into microcrackes and pores giving a low contact resistance (about $10^{-7}$ $\Omega$cm$^2$) between metal layer and HTS.

The rod-shaped or block superconductor is completely covered by a copper alloy using an electrochemical process with a citrate-like electrolytic solution of the composition:

Copper sulfate CuSO$_4$×5 H$_2$O 5–20 g/l
Nickel sulfate NiSO$_4$×7H$_2$O 30–100 g/l
Lemon acid C$_6$H$_8$O$_7$×H$_2$O 80–100 g/l
Sodium chloride NaCl 3–5 g/l A preferred embodiment of the disclose galvanic process is the operation of a DC power source with constant or pulsed current. Especially due to the pulsation in positive and negative direction the deposition the deposition can be regulated in a very sensitive manner. A further preferred embodiment is provided by magnetic fields at the galvanic cell with improving the homogeneity of the layers.

The application of the electrolytic solutions and solvents is less environment sensitive compared to the alkaline cyanide solutions which enable a galvanic deposition of Cu alloys on the new high temperature superconductors, too:

Sodium carbonate $Na_2CO_3 \times 10\ H_2O$ 20–30 g/l
Sodium bisulfate $Na_2SO_3 \times 9H_2O$ 20–30 g/l
Copper acetate 20 g/l
Potassium cyanide KCN 20 g/l A further advantage of the invention is the mechanical stabilization of superconductor provided by the deposition of brass or CuNi on the surface of HTS. The plating process is performed with mixed solutions of 0.1 n copper cyanide and 0.1 Zinc cyanide. The current potential curves of Cu and Zn are close together by 0.2 V at a current density of 0.1–0.3 $A/dm^2$, ideally situated to deposit a homogeneous brass layer on HTS surfaces. Alternatively, at the so called galvanic-thermal process the layers of Cu and Zn are electroplated separately and after that the alloying is performed at temperatures between 300 and 600° Celsius.

Analogously, Cu/CuNi hybrid layers are electroplated on HTS surfaces and improve the mechanical stability of the superconductors.

Figure 4:
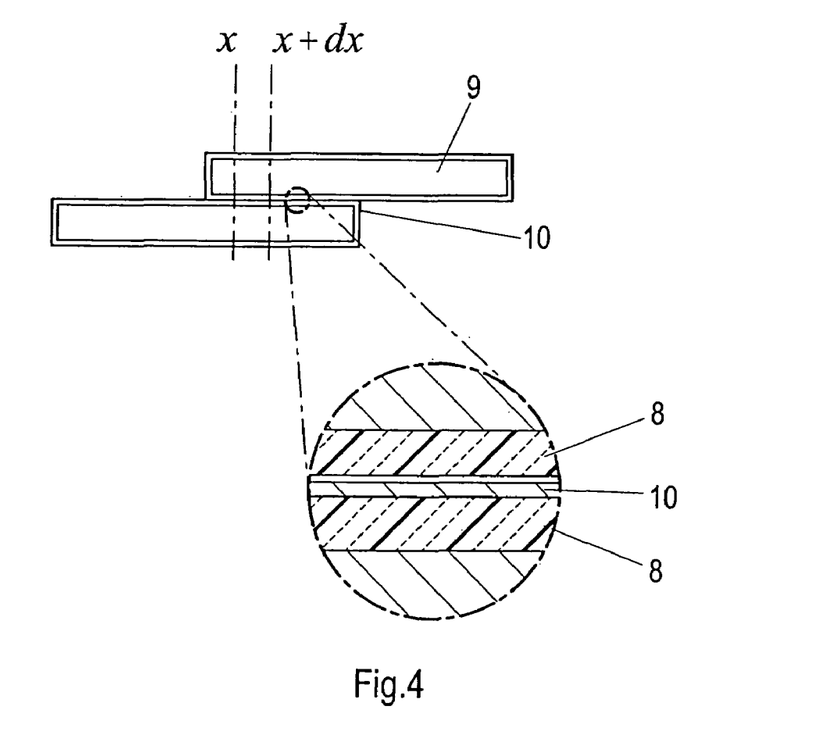
FIG. 4 is a schematic of joining superconductors by surface metal layers

The stabilization effect is due to the penetration of Cu and Ni atoms or clusters into the HTS material (Cu has very small atoms—the diffusive force of Cu is high). The advantages of the disclosed plating method is the solderability and the higher strength of the HTS materials Accordingly, the superconductors can be easily assembled in a modular manner as illustrated in FIG. 4. Single modules 8 are coupled and soldered t longer length. The key feature f r assembling components is the deposition of Cu or Cu alloys 10 on the surface of high temperature superconductors and its mechanical and chemical stability under the solder process.

FIGURE REFERENCE

1 Anode
2 Cathode
3 DC power supply
4 Sulfur acid electrolyte
5 Magnetic assembly
6 Magnetic field
7 High Temperature Superconductor (HTS) Module
8 Superconductor
9 Copper alloy
10 Solder

The invention claimed is:

1. A process for making a metallic deposition on High Temperature Superconductors (HTS) with a copper-oxygen basic structure in the stoichiometric and non-stoichiometric composition, or on the Bismuth HTS, essentially consisting of the step of electroplating copper or copper alloy on said High Temperature Superconductor (HTS) with an aqueous copper sulfate solution for a fabrication of low ohmic contacts with small electrical and thermal contact resistance values, and for providing a stable metallization between the High Temperature Superconductor (HTS) and the copper or copper alloy layer.

2. The process according to claim 1, characterized, that on the HTS surface copper is plated totally or copper structures are patterned on the surface.

3. The process after claim 1, characterized, that electroplating is performed in a copper sulfate bath, wherein the bath can be ultrasonically excited for increasing the hardness of the copper layer and for obtaining an effect of reduced depth selectivity.

4. The process as defined in claim 1, characterized, that copper in form of copper alloys is plated.

5. The process according to claim 1, characterized in that the copper alloy in form of a copper nickel compounds is plated.

6. The process according to claim 1, characterized in that the deposited copper is a copper zinc compound.

7. The process as defined in claim 1, characterized, that a galvanic cell is combined with a permanent and/or alternating magnetic field.

8. The process according to claim 1, characterized, that a galvanic layer of a copper alloy is an improved adhering interface, wherein further galvanic metallic layers, selected from the group of noble metals, silver, gold, platinum, iridium, ruthenium, rhenium, palladium, osmium, tungsten, as well as the metals nickel, chromium, molybdenum and vanadium are plated on copper alloy.

9. Process as defined in claim 1, characterized, that copper or copper alloy layer using chemical and/or thermal treatment are reacted to stable oxides.

10. The process according to claim 1, characterized in that a thermal treatment of copper and/or copper alloys is performed at temperatures between 80–100° Celsius in order to achieve a stable oxide of $Cu_2O$.

11. A process for making a metallic deposition on High Temperature Superconductors (HTS) with a copper-oxygen basic structure as on the RE 123 Superconductor family (RE=Y and Rare Earth Group) in the stoichiometric and non-stoichiometric composition, or on the Bismuth HTS $(Bi_2Sr_2CaCu_2O_{8-x}$ (Bi 2212) or $Bi_2Sr_2Ca_2Cu_3O_{10+y}$ (Bi2223), essentially consisting of the step of electroplating copper or copper alloy on a High Temperature Superconductor (HTS) with an aqueous copper sulfate solution for the fabrication of low ohmic contacts with small electrical and thermal contact resistance values, and for providing a stable metallization between HTS and the copper or copper alloy layer.

12. The process according to claim 11, characterized, that on the HTS surface, copper is plated totally or copper structures are patterned on the surface.

13. The process according to claim 11, characterized, that copper or copper structures are deposited on thin and/or on thick film high temperature superconductors.

14. The process as defined in claim 11, characterized, that the electroplating is performed in a copper sulfate bath, wherein the bath can be ultrasonically excited, resulting in increasing hardness of the copper layer and causing a reduced depth selectively with improved layer homogeneity.

15. The process according to claim 11, characterized in that copper sulfate galvanization/plating is performed by pulse current plating (forward/reverse).

16. The process according to claim 11, characterized in that the copper plating is performed in an aqueous solution with a concentration in the range from 20–300 g $CuSO_4 \times 5H_2O$ per liter.

17. The process as defined in claim 11, characterized, that the electroplating process is performed in a galvanic cell, which can be combined with a permanent and/or alternating magnetic field.

18. The process according to claim 11, characterized, that the layer of copper or copper alloy coated by plating is an improved adhering interface, wherein further galvanic metallic layers, selected from the group of noble metals, silver, gold, platinum, iridium, ruthenium, rhenium, palladium, osmium, tungsten, as well as the metals nickel, chromium, molybdenum and vanadium are plated on the copper or alloy layer.

19. The process as defined in claim 11, characterized, that the copper or copper alloy layer deposited by electroplating are reacted to stable oxides using chemical and/or thermal treatment.

20. The process according to claim 11, characterized in that the deposited layers of copper or copper alloys are thermally treated at moderate temperatures in order to achieve a stable oxide of the type $Cu_2O$.

21. A plating method comprising the steps:
furnishing a galvanic container;
placing an aqueous copper sulfate solution into the galvanic container;
placing a copper containing anode into the aqueous copper sulfate solution;
placing a copper oxide based high temperature superconductor into the aqueous copper sulfate solution for forming a cathode;
connecting the copper containing anode and the cathode to a direct current electrical power source;
electroplating copper directly onto a surface of the copper oxide based high temperature superconductor for forming a copper plated copper oxide based high temperature superconductor.

22. The plating method according to claim 21 wherein the copper oxide based high temperature superconductor is a ceramic material.

23. The plating method according to claim 21 further comprising
removing the copper plated copper oxide based high temperature superconductor from the electrolyte;
disconnecting the copper plated copper oxide based high temperature superconductor from the power source;
cooling the copper plated copper oxide based high temperature superconductor to a temperature delivering superconductivity;
carrying electrical current through the copper plated copper oxide based high temperature superconductor;
bypassing grain boundaries and other electrical barriers in the copper oxide based high temperature superconductor to improve the electrical stability with the electrical current.

24. The plating method according to claim 21 further comprising
connecting the copper containing anode and the cathode to a direct current electrical power source while maintaining a high current density.

25. The plating method according to claim 21 further comprising
generating a magnetic field close to the cathode for obtaining a homogeneous and fine grained layer structure of the plated copper.

26. The plating method according to claim 21 further comprising
employing an electrolyte having the aqueous composition
5 to 10 gram per liter copper pyrophosphate $Cu_2P_2O_7$
40 to 90 gram per liter nickel chloride $NiCl_2 \times 6H_2O$
300 to 400 gram per liter potassium pyrophosphate or sodium pyrophosphate $(K/Na)_4 P_2O_7 \times 10 H_2O$
for plating a copper nickel layer onto the copper oxide based high temperature superconductor.

27. The plating method according to claim 21 further comprising
employing an electrolyte having the aqueous composition of about
5 to 20 gram per liter copper sulfate $CuSO_4 \times 5H_2O$
30 to 100 gram per liter nickel sulfate $Ni SO_4 \times 7H_2O$
80 to 100 gram per liter citric acid $C_6H_8O_7 \times H_2O$
3 to 5 gram per liter sodium chloride NaCl
for plating a copper nickel layer onto the copper oxide based high temperature superconductor.

28. The plating method according to claim 21 further comprising
employing an electrolyte having the aqueous composition of about
20 to 30 gram per liter sodium carbonate $Na_2CO_3 \times 10H_2O$
20 to 30 gram per liter sodium bisulfate $Na_2SO_3 \times 9H_2O$
20 gram per liter copper acetate
20 gram per liter potassium cyanide
for plating a copper layer onto the copper oxide based high temperature superconductor.

29. The plating method according to claim 21 wherein the aqueous copper containing electrolyte is an aqueous solution of copper sulfate further comprising
ultrasonically exciting the aqueous solution of copper sulfate for increasing the hardness of the copper layer and for obtaining an effect of reduced depth selectivity.

30. The plating method according to claim 21 further comprising
plating under a current density of about 0.1 to 0.3 A/dm$^2$.

31. The plating method according to claim 29 further comprising
growing the copper layer to a thickness of more than 10 micrometers.

32. A process for making a metallic deposition on High Temperature Superconductors (HTS) with a copper-oxygen basic structure as in the RE 123 Superconductor family (RE=Y and Rare Earth Group) in the stoichiometric and non-stoichiometric composition, and in the Bismuth HTS ($Bi_2Sr_2CaCu_2O_{8-x}$ (Bi 2212) or $Bi_2Sr_2Ca_2Cu_3O_{10+y}$ (Bi2223), essentially consisting of the steps of
furnishing an aqueous copper sulfate solution;
placing the High Temperature Superconductors (HTS) with a copper-oxygen basic structure as in the RE 123 Superconductor family (RE=Y and Rare Earth Group) in the stoichiometric and non-stoichiometric composition, and in the Bismuth HTS ($Bi_2Sr_2CaCu_2O_{8-x}$ (Bi 2212) or $Bi_2Sr_2Ca_2Cu_3O_{10+y}$ (Bi2223) into the aqueous copper sulfate solution;
electroplating copper or copper alloys from the aqueous copper sulfate solution directly onto the High Temperature Superconductors (HTS) with a copper-oxygen basic structure as in the RE 123 Superconductor family (RE=Y and Rare Earth Group) in the stoichiometric and non-stoichiometric composition, and in the Bismuth HTS ($Bi_2Sr_2CaCu_2O_{8-x}$ (Bi 2212) or $Bi_2Sr_2Ca_2Cu_3O_{10+y}$ (Bi2223) that for a fabrication of low ohmic contacts with small electrical and thermal contact resistance values, and for providing a stable metallization between the High Temperature Superconductors (HTS) with a copper-oxygen basic structure as in the RE 123 Superconductor family (RE=Y and Rare Earth Group) in the stoichiometric and non-stoichiometric composition, and in the Bismuth HTS ($Bi_2Sr_2CaCu_2O_{8-x}$ (Bi 2212) or $Bi_2Sr_2Ca_2Cu_3O_{10+y}$ (Bi2223) and the electrically or thermally coupling copper or copper alloys.

33. A process for making a metallic deposition on a copper oxide based high temperature superconductor comprising the steps:
furnishing an aqueous copper sulfate solution;
placing a copper oxide based high temperature superconductor into the aqueous copper sulfate solution;
electroplating copper from the aqueous copper sulfate solution directly onto a surface of the copper oxide based high temperature superconductor for forming a copper oxide based high temperature superconductor having a surface directly electroplated with copper.

34. A process for making metallic copper plating on High Temperature Superconductors (HTS) as substrate with a copper-oxygen basic structure, as on the RE1Ba2Cu3O7−x (RE123) family, with RE=Y and Rare Earth group in stoichiometric and nonstoichiometric composition, and on the Bismuth HTS family $Bi_2Sr_2CaCu_2O_{8-x}$ (Bi 2212) or $Bi_2Sr_2Ca_2Cu_3O_{10+y}$ (2223), wherein the metallic plating creates between substrate and the copper layer a low ohmic electrical and a high strength mechanical interface structure, which is obtained by,
(a) an electro galvanizing/electroplating copper process in an electrolytic acidic aqueous solution bath,
(b) with an aqueous copper containing electrolyte consisting of copper sulfate solution $CuSO_4 \times 5H_2O$ in a concentration from 20 g per liter up to saturation,
(c) processing in galvanic cell with the copper oxide based high temperature superconducting substrate forming the cathode, and the copper electrode forming the anode,
(d) applying the voltage of a direct current electrical power source to the electrodes to create the electric field of sufficient strength between the electrodes and plating a surface of the copper oxide based high temperature superconducting substrate for forming a copper plated high temperature superconductor.

35. The process according to claim 34, characterized, that electroplating is performed, wherein the electrolytic aqueous copper sulfate bath, can be ultra-sonically excited for increasing the hardness of the copper layer and for obtaining the effect of reduced depth selectivity during the plating.

36. The process as defined in claim 34, characterized that the galvanic cell and the electrochemical reactions are superposed by permanent and/or alternating magnetic fields to improve electrodeposition.

37. The process according to claim 34, characterized, that electroplating copper on a high temperature superconducting surface is performed continuously, discontinuously by pulsing the power supply to create recover and relaxation phases for the plating surface and pulse plating with alternating current direction (forward/reverse).

38. The process according to claim 34, characterized, that on the HTS surface copper is plated totally or copper structures are patterned on the surface.

39. The process according to claim 34, characterized, that copper or copper structures are deposited on bulk ceramic high temperature superconductor surfaces.

40. The process according to claim 34, characterized, that copper or copper structures are plated on thin and/or thick film high temperature superconductors.

41. The process as defined in claim 34, characterized, that copper in form of copper alloys is plated.

42. The process according to claim 34, characterized, that the copper alloy in form of a copper nickel compound is plated.

43. The process according to claim 34, characterized in that the deposited copper is a copper zinc compound.

44. The process according to claim 34, characterized, that the galvanic layer of copper is an improved interface layer within metallic layers on copper oxide based high temperature superconductors, wherein further galvanic metallic layers, selected from the group of noble metals silver, gold, platinum, iridium, ruthenium, rhenium, palladium, osmium, tungsten, as well as the transition metals vanadium, nickel, chromium and molybdenum where plated on it.

45. The process as defined in claim 34, characterized, that electroplated layers using chemical and/or thermal treatment are reacted to stable oxides.

46. The process according claim 34, characterized in that a thermal treatment of galvanic layers of copper or copper alloys is performed at temperatures between 80–100° Celsius in order to achieve a stable $Cu_2O$ oxidation state.

47. An electro plating method comprising the steps:
Furnishing a galvanic container; placing an aqueous copper sulfate containing electrolyte into the galvanic container; placing a copper containing anode into the aqueous copper sulfate containing electrolyte;
Placing a copper oxide based high temperature superconductor into the aqueous copper sulfate containing electrolyte for forming a cathode; connecting the copper containing anode and the cathode to a direct current electrical power source;
Electroplating copper onto a surface of the copper oxide based high temperature superconductor for forming a copper plated copper oxide based high temperature superconductor.

48. The plating method according to claim 47 wherein the copper oxide based high temperature superconductor is a ceramic bulk material.

49. The plating method according to claim 47 wherein the copper oxide based high temperature superconductor is a thin film.

50. The plating method according to claim 47 further comprising, disconnecting the copper plated copper oxide based high temperature superconductor from the plating power source; removing the copper oxide based high temperature superconductor from the electrolytic bath; cooling the copper plated copper oxide based high temperature superconductor to a temperature delivering superconductivity; carrying a high electrical current through the copper plated copper oxide based high temperature superconductor;
bypassing grain boundaries or other electrical barriers in the copper oxide based high temperature superconductor to improve the electrical stability.

51. The plating method according to claim 47, further comprising, connecting the anode and the cathode to direct continuous/pulsed current to an electrical current power source while maintaining an electrolytic high current density.

52. The plating method according to claim 47, further comprising generating a magnetic field close to the cathode for obtaining a homogeneous and fine grain layer structure of the plated copper.

53. The plating method according to claim 47 further comprising employing an electrolyte having an aqueous composition,
5–10 gram per liter copper pyrophosphate $Cu_2P_2O_7$
40 to 90 gram per liter nickel chloride $NiCl2 \times 6H_2O$
300–400 gram per liter potassium pyrophosphate or sodium pyrophosphate $(K/Na)_4P_2O_7 \times 10H_2O$
for plating copper nickel layer onto the copper oxide high temperature superconductor.

54. The plating method according to claim 47 further comprising
Employing an electrolyte having an aqueous composition of about
5 to 20 gram per liter copper sulphate $CuSO_4 \times 5H_2O$
30 to 100 gram per liter nickel sulfate $NiSO_4 \times 7H_2O$
80–100 gram per liter citric acid $C_6H_8O_7 \times H_2O$
3–5 gram per liter sodium chloride NaCl for plating a copper nickel layer onto the copper oxide based high temperature superconductor.

55. The plating method according to claim 47 further comprising employing an electrolyte having an aqueous composition of about
- 20 to 30 gram per liter sodium carbonate $Na_2CO_3 \times 10H_2O$
- 20–30 gram per liter sodium bisulfat $Na_2SO_3 \times 9H_2O$
- 20 gram per liter copper acetate
- 20 gram per liter potassium cyanide
- for plating a copper layer onto the copper oxide based high temperature superconductor.

56. The plating method according to claim 47 wherein the aqueous copper containing electrolyte is an aqueous solution of copper sulfate further comprising ultrasonically exciting the aqueous solution of copper sulphate for increasing the hardness of the copper layer and for obtaining an effect of reduced depth selectivity.

57. The plating method according to claim 47 further comprising plating under an electrolytic current density of about 0.1 to 0.3 $A/dm^2$.

58. The plating method according to claim 47 further comprising growing the copper layer to a thickness of more than 10 micrometers.

* * * * *